United States Patent
Ho et al.

(10) Patent No.: US 10,044,445 B2
(45) Date of Patent: Aug. 7, 2018

(54) TECHNIQUES FOR REDUCING ELECTRICAL INTERCONNECTION LOSSES BETWEEN A TRANSMITTER OPTICAL SUBASSEMBLY (TOSA) AND ASSOCIATED DRIVER CIRCUITRY AND AN OPTICAL TRANSCEIVER SYSTEM USING THE SAME

(71) Applicant: Applied Optoelectronics, Inc., Sugar Land, TX (US)

(72) Inventors: I-Lung Ho, Sugar Land, TX (US); Chong Wang, Stafford, TX (US); YongXuan Liang, Stafford, TX (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 0 days.

(21) Appl. No.: 15/252,743

(22) Filed: Aug. 31, 2016

(65) Prior Publication Data
US 2018/0062756 A1 Mar. 1, 2018

(51) Int. Cl.
*H04B 10/00* (2013.01)
*H04B 10/572* (2013.01)
(Continued)

(52) U.S. Cl.
CPC .......... *H04B 10/572* (2013.01); *G02B 6/428* (2013.01); *G02B 6/4249* (2013.01);
(Continued)

(58) Field of Classification Search
CPC .... H04B 10/40; H04B 10/43; H04B 10/2507; H04B 10/2504; H04B 10/50;
(Continued)

(56) References Cited

U.S. PATENT DOCUMENTS 6,118,912 A 9/2000 Xu
7,450,858 B2 * 11/2008 Verdiell ................ H01S 5/4087
398/164
(Continued)

FOREIGN PATENT DOCUMENTS

JP 200412844 A 1/2004
KR 1020060066256 A 6/2006

OTHER PUBLICATIONS

U.S. Office Action dated Jul. 27, 2017, received in U.S. Appl. No. 15/252,702, 8 pgs.
(Continued)

*Primary Examiner* — Hanh Phan
(74) *Attorney, Agent, or Firm* — Grossman Tucker Perreault & Pfleger, PLLC; Norman S. Kinsella

(57) ABSTRACT

Techniques are disclosed for providing relatively short distances between multi-channel transmitter optical subassemblies (TOSAs) and associated transmit connecting circuit in order to reduce losses due to signal propagation delays, also sometimes referred to as signal flight time delays. In an embodiment, a TOSA includes a plurality of laser assemblies disposed along a same sidewall of the TOSA along a longitudinal axis. The TOSA may be disposed within an optical transceiver housing in a transverse orientation, whereby a longitudinal center line of the multi-channel TOSA is substantially perpendicular to the longitudinal axis of the optical transceiver housing. The TOSA may be positioned adjacent an end of the optical transceiver housing having a transmit connecting circuit. Thus each of the plurality of laser assemblies may be positioned at a relatively short distance, e.g., 120 microns or less, away from the transmit connecting circuit.

11 Claims, 7 Drawing Sheets

(51) Int. Cl.
　　　*G02B 6/42*　　　(2006.01)
　　　*H04B 10/50*　　(2013.01)
　　　*H04J 14/02*　　(2006.01)
　　　*G02B 6/293*　　(2006.01)
　　　*H01S 5/12*　　　(2006.01)

(52) U.S. Cl.
　　　CPC ............ *H04B 10/503* (2013.01); *H04J 14/02* (2013.01); *G02B 6/2938* (2013.01); *G02B 6/29365* (2013.01); *H01S 5/12* (2013.01)

(58) Field of Classification Search
　　　CPC ..... H04B 10/506; H04B 10/503; H04J 14/02; G02B 6/4278; G02B 6/4249; G02B 6/4246
　　　USPC ......... 398/135, 136, 137, 138, 139, 164, 79, 398/182, 183, 158, 159; 385/24, 89, 90, 385/92, 93, 14, 8, 148
　　　See application file for complete search history.

(56) References Cited

U.S. PATENT DOCUMENTS

| | | | |
|---|---|---|---|
| 7,583,900 B2* | 9/2009 | Dallesasse | G02B 6/4201 398/135 |
| 7,703,992 B2 | 4/2010 | Pfnuer | |
| 7,945,169 B2* | 5/2011 | Oki | G02B 6/4246 174/254 |
| 8,985,871 B2* | 3/2015 | Mizobuchi | G02B 6/43 385/14 |
| 8,995,845 B2* | 3/2015 | Du | H04B 10/40 385/24 |
| 9,250,401 B2* | 2/2016 | Lim | G02B 6/4215 |
| 9,350,454 B2* | 5/2016 | Xu | G02B 6/4215 |
| 9,391,709 B2* | 7/2016 | Tamura | H04B 10/506 |
| 9,684,141 B1 | 6/2017 | Ho et al. | |
| 2001/0028765 A1 | 10/2001 | Toratani et al. | |
| 2003/0063844 A1 | 4/2003 | Caracci et al. | |
| 2008/0193135 A1 | 8/2008 | Du et al. | |
| 2011/0058771 A1* | 3/2011 | Lee | G02B 6/4215 385/33 |
| 2013/0108262 A1 | 5/2013 | Lim et al. | |
| 2015/0153522 A1 | 6/2015 | Nakagawa et al. | |
| 2016/0050019 A1 | 2/2016 | Gothoskar et al. | |

OTHER PUBLICATIONS

PCT Search Report and Written Opinion dated Sep. 29, 2017, received in corresponding PCT Application No. PCT/US17/49311, 12 pgs.

PCT Search Report and Written Opinion dated Sep. 21, 2017, received in related PCT Application No. PCT/US17/49305, 10 pgs.

* cited by examiner

US 10,044,445 B2

TECHNIQUES FOR REDUCING ELECTRICAL INTERCONNECTION LOSSES BETWEEN A TRANSMITTER OPTICAL SUBASSEMBLY (TOSA) AND ASSOCIATED DRIVER CIRCUITRY AND AN OPTICAL TRANSCEIVER SYSTEM USING THE SAME

CROSS-REFERENCE TO RELATED APPLICATIONS

The present application is related to co-pending U.S. patent application Ser. No. 15/252,702, titled "An Optical Component Assembly With a Vertical Mounting Structure for Multi-Angle Light Path Alignment and an Optical Subassembly Using the Same" filed on Aug. 31, 2016, the entire disclosure of which is incorporated herein by reference.

TECHNICAL FIELD

The present disclosure generally relates to optical transceiver modules, and more particularly, to an optical transceiver housing having a multi-channel transmitter optical subassembly (TOSA) with laser assemblies disposed along a same sidewall of the multi-channel TOSA to allow for placement of the multi-channel TOSA within the optical transceiver that minimizes or otherwise reduces the distance, and by extension electrical signal propagation or flight time, between each laser assembly and a transmit connecting circuit configured to drive the same.

BACKGROUND INFORMATION

Optical transceivers are used to transmit and receive optical signals for various applications including, without limitation, internet data centers, cable TV broadband, and fiber to the home (FTTH) applications. Optical transceivers provide higher speeds and bandwidth over longer distances, for example, as compared to transmission over copper cables. The desire to provide higher speeds in smaller optical transceiver modules for a lower cost has presented challenges, for example, with respect to maintaining optical efficiency (power), thermal management, insertion loss, and manufacturing yield.

Optical transceivers can include one or more transmitter optical subassemblies (TOSAs) and receiver optical subassemblies (ROSAs) for the purpose of transmitting and receiving optical signals. As channel density becomes an increasingly important aspect of optical transceivers, the ability scale-down while maintaining nominal transceiver performance raises numerous non-trivial challenges.

BRIEF DESCRIPTION OF THE DRAWINGS

These and other features and advantages will be better understood by reading the following detailed description, taken together with the drawings wherein.

Figure 1A:
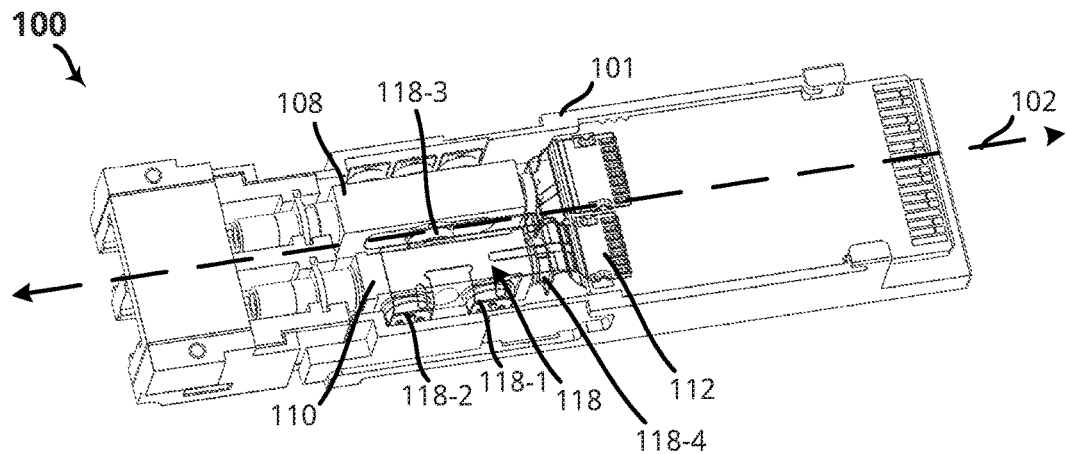
FIG. 1A is a perspective view of an example small form-factor (SFF) pluggable transceiver with a multi-channel TOSA configuration and a multi-channel ROSA.

These and other features of the present embodiments will be understood better by reading the following detailed description, taken together with the figures herein described. The accompanying drawings are not intended to be drawn to scale. In the drawings, each identical or nearly identical component that is illustrated in various figures is represented by a like numeral. For purposes of clarity, not every component may be labeled in every drawing.

DETAILED DESCRIPTION

Increased demand for high-speed optical transceivers, largely due to the adoption of network standards such as IEEE 802.3bm-2015 and others that prescribe 100 Gigabit Ethernet (100 GbE) and beyond, raises non-trivial challenges in the design of optical subassembly modules. For example, the INF-8074i titled "Specification for SFP (Small Form factor Pluggable) Transceiver" adopted by the SFF Committee on May 12, 2001 established specific standard physical dimensions for optical transceivers that included a height of 8 millimeters (mm), a width of 13.4 mm and a depth (or length) of 56.5 mm. Other standards, such as INF-8077i titled "10 Gigabit Small Form Factor Pluggable Module" adopted by the Small Form Factor Committee in Aug. 31, 2005 also have standardized similarly constrained housing dimensions. In any event, these housing constraints further complicate increasing optical transceiver performance due to heat management issues, manufacturing complexity and losses introduced as a result of high frequency optical and electrical switching, just to name a few.

The present disclosure has identified electrical interconnections that couple optical subassemblies to their associated circuitry within SFF housing impede continued increases in optical transceiver performance. For instance, a multi-channel transmitter optical subassembly (TOSA) disposed within an SFF housing generally includes a number of laser diodes, e.g., TO can lasers, with each laser diode being configured to generate an associated channel wavelength. To drive the laser diodes, the optical transceiver may include associated circuitry that is electrically coupled to pins or other terminals of the laser diodes. For example, as shown in FIG. 1A, a SFF optical transceiver 100 is implemented as a quad small form-factor pluggable (QSFP) transceiver and includes a multi-channel receiver optical subassembly (ROSA) 108 and a multi-channel transmitter optical subassembly 110 disposed within housing 101. As shown, each of the TO can laser assemblies 118-1 to 118-4 of the multi-channel TOSA 110 is coupled to a transmit connecting circuit (not shown) by way of an intermediate flexible printed circuit (FPC) 112.

The FPC 112 advantageously provides tolerance and flexibility for the purposes of electrically coupling each of the TO can laser assemblies 118-1 to 118-4 to associated driver circuitry. However, the physical dimensions of the FPC 112 may introduce transmission line effects that may adversely affect data being sent as the I/O signaling speeds increase to support high-speed transmissions, e.g., 25 megabits (Mbps) and greater per channel. These affects are due, at least in part, to the particular route of each trace of the FPC 112 and the overall length of each trace that interconnects components. This is because traces etched or otherwise routed on a FPC carry signals between circuits at a certain speed. The propagation of the signal between the circuits, also known as its "time of flight," is proportional to the length of the trace. Approaches to trace routing thus generally favor shortest, straight-line routes between circuits. In addition, approaches to trace routing generally avoid introducing right-angles, which may result in capacitive increases and an impedance change in the corner region of a right-angle route. Unfortunately, SFF housing constraints requires a tradeoff between designing optical subassemblies with physical dimensions that "fit" within a cavity of the same while also providing an optimized distance between optical components, such as between the TO can laser assemblies and 118-1 to 118-4 and associated circuitry.

Figure 1B:
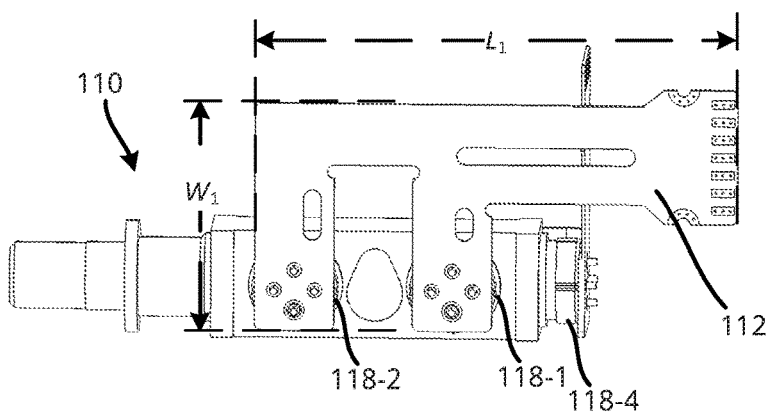
FIG. 1B is a side view of the multi-channel TOSA of FIG. 1A and includes a flexible printed circuit (FPC) for electrically coupling laser assemblies of the multi-channel TOSA to associated driver circuitry.

For example, the multi-channel TOSA 110 is disposed length-wise and in parallel with the longitudinal axis 102, which enables the multi-channel TOSA 110 to reside within the housing 101 along with the multi-channel ROSA 108. This arrangement requires the FPC 112 to effectively "bridge the gap" and electrically couple the TO can laser assemblies 118-1 to 118-4 to driver circuitry via traces of the FPC 112 that accommodate the position of the multi-channel TOSA 110 within the housing 101. Thus, and as shown in FIG. 1B in greater detail, the FPC 112 includes a right-angle L-shaped configuration having an overall width of $W_1$ and an overall length of $L_1$. To provide a specific example, consider that in some approaches to SFF optical transceivers the overall width $W_1$ may measure about 5 mm and the Length $L_1$ may measure about 12 mm, resulting in a combined distance for each trace of about 17 mm. This distance may significantly impact switching speeds necessary to ensure nominal performance of an optical transceiver, e.g., because of the signal flight time resulting from the trace lengths. And thus the FPC 112 may prevent high-frequency switching that is necessary for transmitting optical signals having bandwidth of 100 megabits per second (Mbps) or more. In addition, the FPC 112 may introduce an undesirable impedance change due to the L-shaped trace route that may further retard high-frequency switching.

Thus, in accordance with an embodiment of the present disclosure, techniques are disclosed for providing electrical interconnections to multi-channel subassemblies, such as multi-channel TOSAs, that feature relatively short trace lengths to couple the same to associated circuitry. In an embodiment, a multi-channel TOSA includes a plurality of laser assemblies disposed along a same sidewall of the multi-channel TOSA along a longitudinal axis. The multi-channel TOSA may be disposed within an optical transceiver housing in a transverse orientation wherein a longitudinal center line of the multi-channel TOSA is substantially perpendicular to the longitudinal axis of the optical transceiver housing. Further, the multi-channel TOSA may be positioned adjacent an end of the transceiver housing having a transmit connecting circuit that is configured to drive the plurality of laser assemblies of the multi-channel TOSA. Thus each of the plurality of laser assemblies are positioned at a relatively short distance away from the transmit connecting circuit, with the relatively short distance providing a straight path for an electrical interconnection device, such as wire bonding. In some cases, the distance between a given laser assembly of the multi-channel TOSA and the transmit connecting circuit, e.g., as measured from electrical pad to electrical pad, may measure about 70 to 120 microns, depending on a desired configuration. In still other cases, the distance between each laser assembly and the transmit connecting circuit may measure effectively zero microns as each as each laser assembly may directly abut a surface of the transmit connecting circuit. Accordingly, the techniques disclosed herein may enable optical transceivers to provide optical signals with a bandwidth of at least 100 Mbps within the physical constraints imposed by SFF housings.

In an embodiment, a multi-channel TOSA is disclosed that includes a housing that comprises a plurality of sidewalls that extend from a first end to a second end along a longitudinal axis. The plurality of sidewalls include at least a first sidewall disposed opposite a second sidewall, and a third sidewall adjoining the first and second sidewalls, with an inner surface of the plurality of sidewalls defining a cavity. The cavity provides a first light path that extends substantially in parallel with the longitudinal axis of the housing. A plurality of light input coupling ports is disposed along the first sidewall, with each light input coupling port providing an input light path that intersects with the first light path. The multi-channel TOSA further includes a plurality of laser assemblies for generating light with different associated channel wavelengths. Each laser assembly is coupled to the first sidewall of the multi-channel TOSA housing adjacent to a respective light input coupling port and optically couples into the first light path (or optical path) by virtue of an associated input light path.

The multi-channel TOSA further includes an optical output port disposed on the second sidewall, with the optical output port having a first end for optically coupling to an external transmit fiber, and a second end for optically coupling to the second light path. The cavity of the multi-channel TOSA housing further includes an optical multiplexing arrangement disposed along the first light path, wherein the optical multiplexing arrangement is configured to optically couple channel wavelengths received via each input light path to the first light path to form a multiplexed light signal. The optical multiplexing arrangement further optically couples the multiplexed light signal to the second light path, allowing transmission of the multiplexed light signal via an external transmit optical fiber during operation of the optical transceiver.

As used herein, "channel wavelengths" refer to the wavelengths associated with optical channels and may include a specified wavelength band around a center wavelength. In one example, the channel wavelengths may be defined by an International Telecommunication (ITU) standard such as the ITU-T dense wavelength division multiplexing (DWDM) grid or course wavelength division multiplexing (CWDM).

The term "coupled" as used herein refers to any connection, coupling, link or the like and "optically coupled" refers to coupling such that light from one element is imparted to another element. Such "coupled" devices are not necessarily directly connected to one another and may be separated by intermediate components or devices that may manipulate or modify such signals. Likewise, the term "directly coupled" or "directly optically coupled" as used herein refers any optical connection that allows light to be imparted from one element to another without the use of an intermediate device such as a fiber.

As used herein singular expressions such as "a," "an," and "the" are not limited to their singular form, and are intended to cover the plural forms as well unless the context clearly indicates otherwise.

From time to time one or more aspects of the present disclosure may be described using ranges. In such instances it should be understood that the indicated ranges are exemplary only unless expressly indicated otherwise. Moreover, the indicated ranges should be understood to include all of the individual values of falling within the indicated range, as though such values were expressly recited. Moreover, the ranges should be understood to encompass sub ranges within the indicated range, as though such sub ranges were expressly recited. By way of example, a range of 1 to 10 should be understood to include 2, 3, 4 . . . etc., as well as the range of 2 to 10, 3 to 10, 2 to 8, etc., as though such values and ranges were expressly recited.

Example Optical Transceiver System

Figure 2:
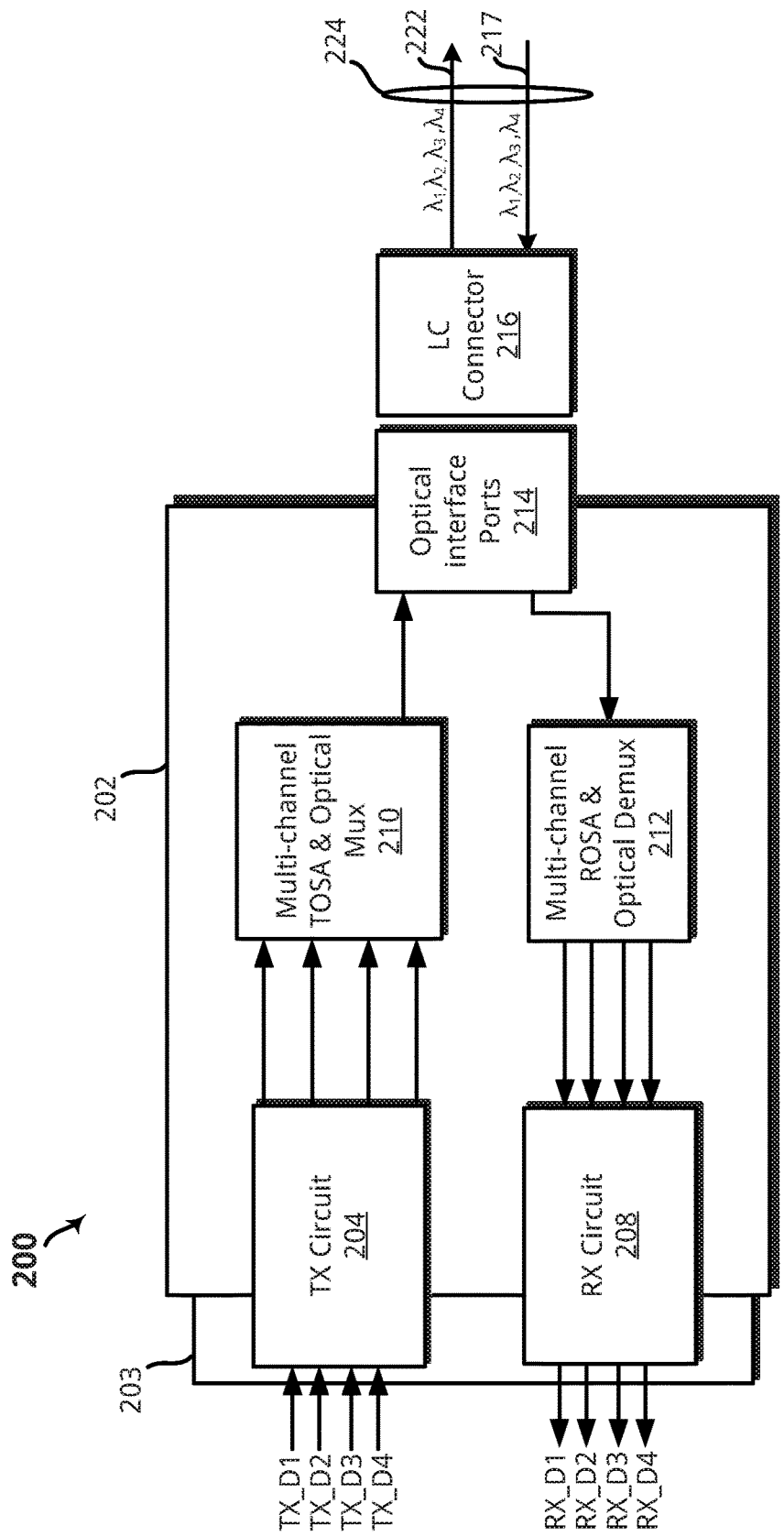
FIG. 2 schematically illustrates an embodiment of an optical transceiver module including a multi-channel transmitter optical sub-assembly (TOSA) and multi-channel receiver optical sub-assembly (ROSA).

Now turning to FIG. 2, there is an optical transceiver 200 consistent with embodiments of the present disclosure. In more detail, the optical transceiver 200 transmits and receives four (4) channels using four different channel wavelengths ($\lambda_1$, $\lambda_2$, $\lambda_3$, $\lambda_4$) and may be capable of transmission rates of at least about 25 gigabits (Gbs) per channel or more. In one example, the channel wavelengths $\lambda_1$, $\lambda_2$, $\lambda_3$, $\lambda_4$ may be 1270 nm, 1290 nm, 1310 nm, and 1330 nm, respectively. The optical transceiver 200 may also be capable of both short transmission distances of tens of meters, for example, to distances of 2 kilometers or more. The optical transceiver 200 may be used, for example, in internet data center applications or fiber to the home (FTTH) applications. In an embodiment, the optical transceiver 200 implements a Quad Small Form-Factor Plugging (QSFP) transceiver. For example, the optical transceiver 200 may be implemented within a QSFP receiver that comports with the "SFF Committee Specification SFF-8665 for QSFP+28 Gb/s 4× Pluggable Transceiver Solution (QSFP28)" published on May 10, 2013. The aspects and embodiments disclosed herein may be used within other transceiver types and is not necessarily limited to QSFP or QFSP+ transceivers. The optical transceiver 200 may be configured for dense wavelength division multiplexing (DWDM) or course wavelength division multiplexing (CWDM), depending on a desired configuration. Although aspects and scenarios disclosed herein discuss a four (4) channel configuration, other channel configurations, e.g., 2, 4, 16, 32, and so on, are within the scope of this disclosure.

As shown, the optical transceiver 200 includes a transceiver housing 202 that includes a multi-channel TOSA 210 for transmitting optical signals on different channel wavelengths, and a multi-channel ROSA arrangement 212 for receiving optical signals on different channel wavelengths. A transmit connecting circuit 204 and a receive connecting circuit 208 provide electrical connections to the multi-channel TOSA 210 and the multi-channel ROSA arrangement 212, respectively, within the transceiver housing 202. The transmit connecting circuit 204 and the receive connecting circuit 208 may communicate with external systems via data bus 203. In some cases, data bus 203 is a 38-pin connector that comports with physical connector QSFP standards and data communication protocols.

In any event, the transmit connecting circuit 204 electrically couples to the electronic components in the multi-channel TOSA 210, e.g., laser assemblies 211-1 to 211-N (FIG. 3A), and the receive connecting circuit 208 electrically couples to the electronic components in the multi-channel ROSA arrangement. The multi-channel ROSA an array waveguide grating (AWG), detectors, amplification circuitry and so on. The transmit connecting circuit 204 and the receive connecting circuit 208 include at least conductive paths to provide electrical connections, and may also include additional circuitry. The multi-channel TOSA 210 transmits and multiplexes multiple different channel wavelengths, and is coupled to an optical interface port 214. The optical interface port 214 may include an LC connector port, although other connector types are also within the scope of this disclosure.

In cases where the optical interface port 214 comprises a duplex, or bi-directional, LC receptacle, the LC connector receptacle provides optical connections to the multi-channel TOSA 210, and provides optical connections to the multi-channel ROSA 212. The LC connector receptacle may be configured to receive and be coupled to a mating LC connector 216 such that transmit optical fiber 222 of the external fibers 224 optically couples to the multi-channel TOSA 210 arrangement, and the receive optical fiber 217 of the external fibers 224 optically couples to the multi-channel ROSA 212.

The multi-channel TOSA 210 can include multiple laser packages and optics for producing associated channel wavelengths, and can couple the same into the transmit optical fiber 222. In particular, the lasers in the multi-channel TOSA 210 can convert electrical data signals (TX_D1 to TX_D4) received via the transmit connecting circuit 204 into modulated optical signals transmitted over transmit optical fiber 222. Each of the laser packages 211-1 to 211-N may include, for example, distributed feedback (DFB) lasers. For example, each laser package 211-1 to 211-N may comprise an edge emitting DFB laser configured to produce a particular channel wavelength. In other cases, each laser packages 211-1 to 211-N may comprise electro-absorption modulated laser (EML) laser diode packages. The multi-channel TOSA 210 may also include monitor photodiodes for monitoring the light emitted by the lasers. The multi-channel TOSA 210 may further include one or more temperature control devices, such as a resistive heater and/or a thermo-electric cooler (TEC), for controlling a temperature of the lasers, for example, to control or stabilize the laser wavelengths.

The multi-channel ROSA arrangement 212 can include demultiplexing optics such as an AWG device 302, and a plurality of detectors (not shown) such as photodiode packages configured to receive de-multiplexed channel wavelengths. The ROSA arrangement 212 can use the detectors and associated circuitry (e.g., a TIA) to detect, amplify and convert de-multiplexed channel wavelengths and can provide the same as electrical data signals, e.g., RX_D1 to RX_D4.

Figure 3A:
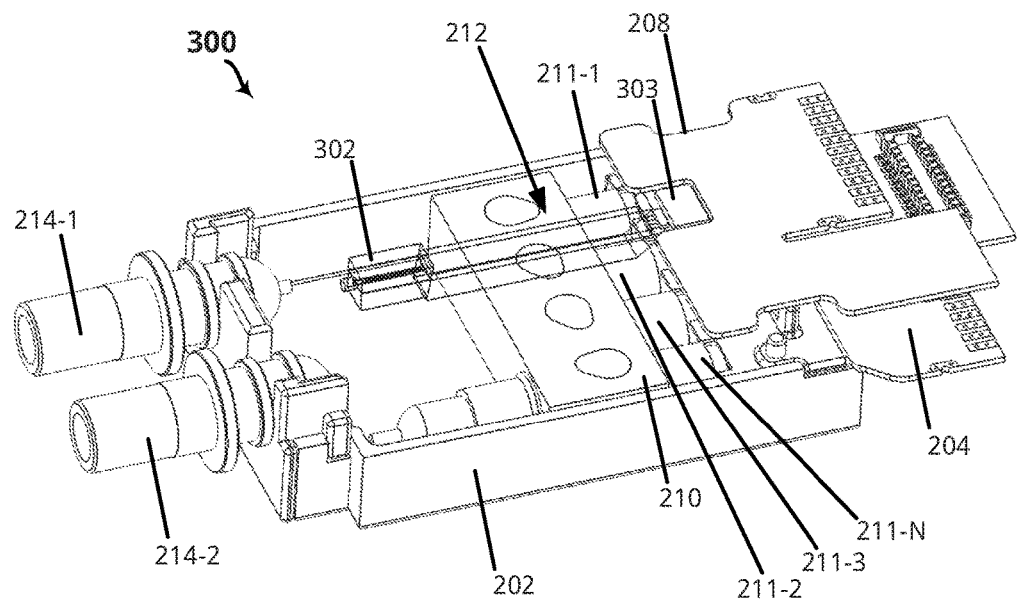
FIG. 3A is a perspective view of an example small form-factor (SFF) pluggable transceiver with a multi-channel TOSA configuration and a multi-channel ROSA, in accordance with an embodiment of the present disclosure.

Referring to FIG. 3A, an example small form-factor (SFF) pluggable optical transceiver 300 with a multi-channel TOSA 110 and multi-channel ROSA 212 is shown in accordance with an embodiment of the present disclosure. In some cases, the optical transceiver 300 may implement the QSFP+ specification, or other applicable pluggable small-form factor specification. To this end, and in an embodiment, the optical transceiver 300 may be compliant with the QSFP28 MSA standard, and may include physical dimensions that conform to the SFF-8661 specification. In other cases, the optical transceiver 300 may implement the C form-factor pluggable (CFP) standard. In any such cases, the optical transceiver 300 may be configured to transmit and receive at a line rate of at least 100 Gb/s, respectively. This may be particularly advantageous when using the optical transceiver in, for example, a 100GBASE-LR4 application, per the IEEE 802.3bx standards.

As shown, the optical transceiver 300 includes a transceiver housing 202 and a multi-channel TOSA 210 disposed within a region of the transceiver housing 202. The multi-channel TOSA 210 includes a plurality of laser packages 211-1 to 211-N configured to generate associated channel wavelengths and associated circuitry. The multi-channel TOSA 210 is discussed in greater detail below with regard to FIGS. 4-6. The multi-channel TOSA 210 electrically couples to the transmit connecting circuit 204 and also couples to the optical interface port 214-1 of the transceiver housing 202 by way of a waveguide device such as an optical fiber (not shown). The transmit connecting circuit 204 may be implemented as a printed circuit board (PCB) or any other suitable substrate for supporting the transmit connecting circuit 204. The optical transceiver 300 further includes a multi-channel ROSA arrangement 212 disposed within a region of the transceiver housing 202. The ROSA arrangement 212 may include an demultiplexing device, such as arrayed waveguide grating (AWG) device 302, photodetectors (not shown), and amplification and conversion circuitry such as a transimpedance amplifier (TIA) 303. The ROSA arrangement 212 electrically couples to a the receive connecting circuit 208, and optically couples to the optical interface receptacle 214-2 at an end of the transceiver housing 202 by way of a waveguide device such as an optical fiber (not shown). The receive connecting circuit 208 may be configured as a PCB, for example, although other embodiments are within the scope of this disclosure.

In an embodiment, the multi-channel TOSA 210 can include a plurality of laser packages 211-1 to 211-N with each comprising, for example, distributed feedback (DFB) laser diode package. Other laser types are also within the scope of this disclosure such as, for example, other directly modulated laser (DML) diodes and TO can-type laser diodes. The particular laser type chosen may be based on a desired application. For instance, applications that require long-distance, e.g., about 10 km or greater, may favor EML lasers. Conversely, applications requiring shorter distances may use DMLs. In any event, and in accordance with an embodiment, each laser package 211-1 to 211-N of the multi-channel TOSA 210 can be configured to transmit at about 25 Gb/s, or greater. Each laser package 211-1 to 211-N of the multi-channel TOSA 210 may provide a relatively narrow spectrum of channel wavelengths such as a single channel wavelength, or may be configured to provide a broad spectrum of channel wavelengths based on associated optics. In an embodiment, the lasers can provide center wavelengths 375 nm to 1650 nm, for example. The multi-channel ROSA arrangement 212 can include a demux device, such as the arrayed waveguide grating (AWG) device 302. The AWG device 302 may be configured to demultiplex a signal, e.g., a WDM signal, received via the optical interface port 214-2 into individual channel wavelengths. An output of the AWG 302 device may be coupled to, for example, an array of quad p-intrinsic-n (PIN) diodes and associated TIAs 303 for the purposes of detecting, amplifying and converting each of the channel wavelengths into an electrical signal. The AWG device 302 can be compatible with channel spacing configurations that comport with, for example, 25 nm IEEE LX-4 grids, 20-nm ITU G.694.2 CWDM grids, and a range of ITU G.694.1 DWDM grids in the range of 400 Ghz to 800 Ghz (e.g., 2 nm to 4 nm).

Figure 3B:
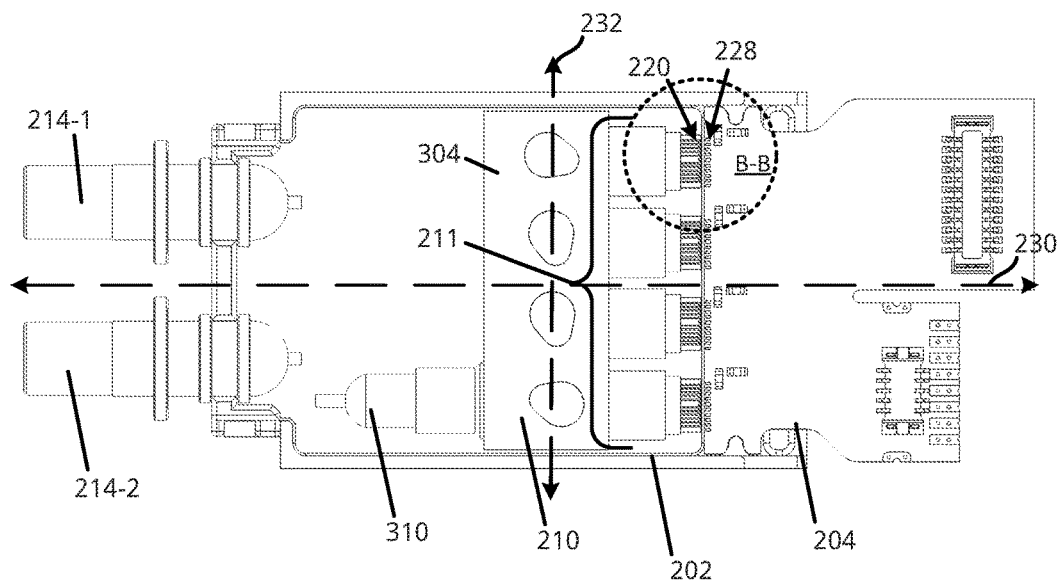
FIG. 3B shows a top plan view of the example SFF pluggable transceiver of FIG. 3A, in accordance with an embodiment of the present disclosure.

Turning to FIG. 3B, a top plan view of the optical transceiver 300 is shown in accordance with an embodiment of the present disclosure. For the purpose of clarity and practicality, the embodiment shown FIG. 3B omits the multi-channel ROSA arrangement 212. As shown, the multi-channel TOSA 210 is shown in a perpendicular orientation relative to the longitudinal axis 230 of the transceiver housing 202. In more detail, the multi-channel TOSA 210 includes a housing 304 defined by a plurality of sidewalls 306-1 to 306-6, which are shown in greater detail in FIG. 4. The housing 304 of the multi-channel TOSA 210 is disposed adjacent to the transmit connecting circuit 204. In some cases, the placement of the multi-channel TOSA thus allows the laser assemblies 211-1 to 211-N to be a relatively short distance from the transmit connecting circuit 204 for the purpose of electrical interconnection. This advantageously enables for relatively short and straight interconnection between the transmit connecting circuit 204 and the plurality of laser assemblies 211-1 to 211-N, and more particularly between the electrical contacts 220 of each of the laser assemblies 211-1 to 211-N and associated electrical contacts 228 of the transmit connecting circuit 204. Thus losses introduced by other approaches that use a relatively lengthy interconnect, such as the FPC 112 of FIGS. 1A and 1B, may be avoided or otherwise reduced.

Figure 3C:
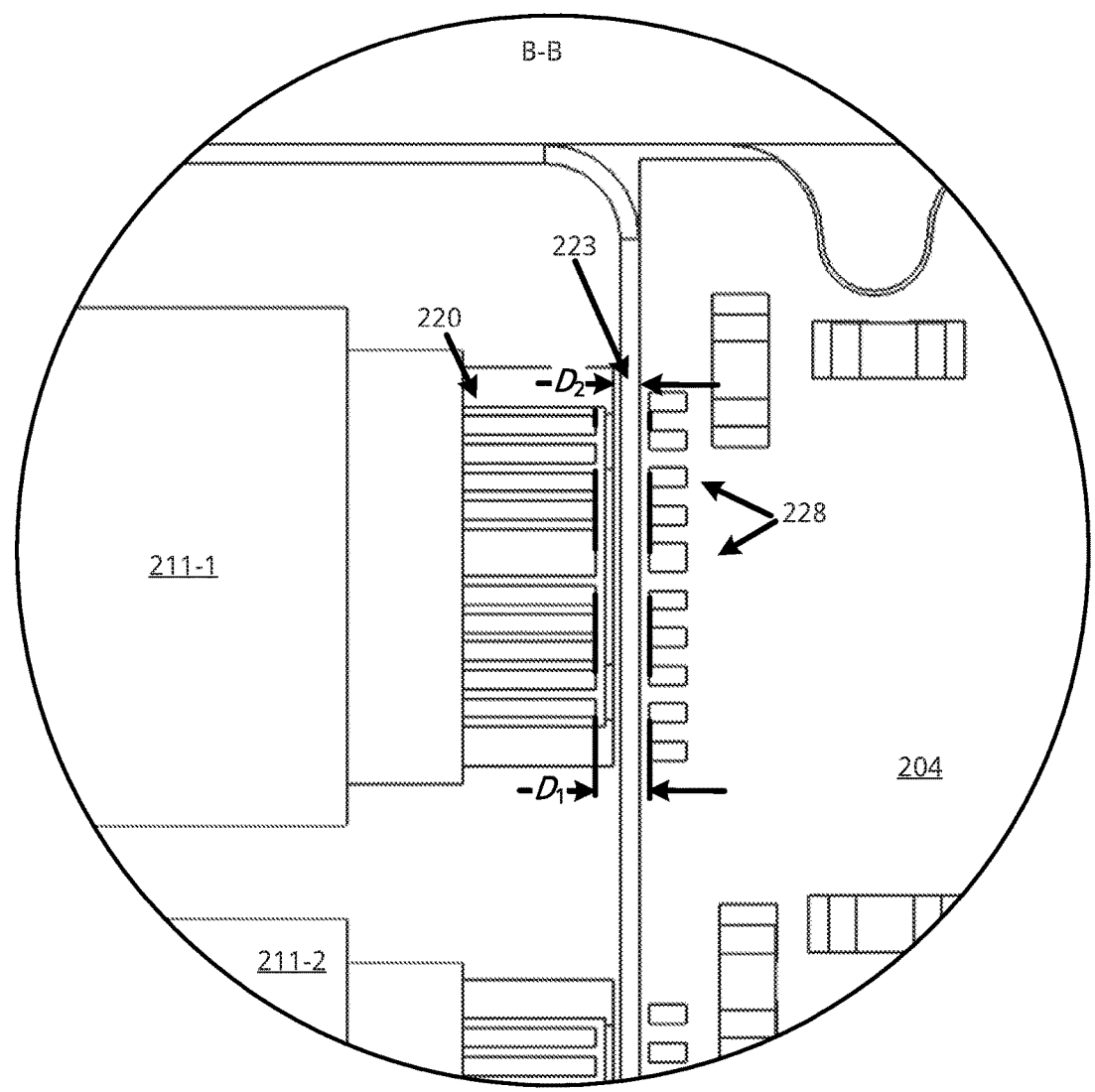
FIG. 3C shows an enlarged section of the example SFF pluggable transceiver of FIG. 3B identified as section B-B.

Turning to FIG. 3C, the area outlined as section B-B in FIG. 3B is shown in greater detail. As shown, the electrical pads 220 of each of the laser assemblies 211-1 to 211-N may be disposed at a distance of $D_1$, with $D_1$ measuring about 70-120 μm microns, although other embodiments are within the scope of this disclosure. In addition, a gap 223 formed between each of the laser assemblies 211-1 to 211-N and the transmit connecting circuit 204 measures a distance $D_2$, with $D_2$ measuring about 0, e.g., directly touching, to about 50 μm, although other embodiments are also within the scope of this disclosure. Thus the distance D2 is relatively short allowing for, for example, wire bonding or other interconnections to be formed to provide electrical connectivity between each of the laser assemblies 211-1 to 211-N and the transmit connecting circuit 204. In an embodiment, the gap 223 may include a continuous distance $D_2$ separating each of the each of the laser assemblies 211-1 to 211-N from the transmit connecting circuit 204, such as shown in FIG. 3C. In other cases, the gap 223 may include a distance $D_2$ that is non-continuous and varies depending on a desired configuration. Accordingly, the present disclosure should not be construed as limited in this regard.

Figure 4:
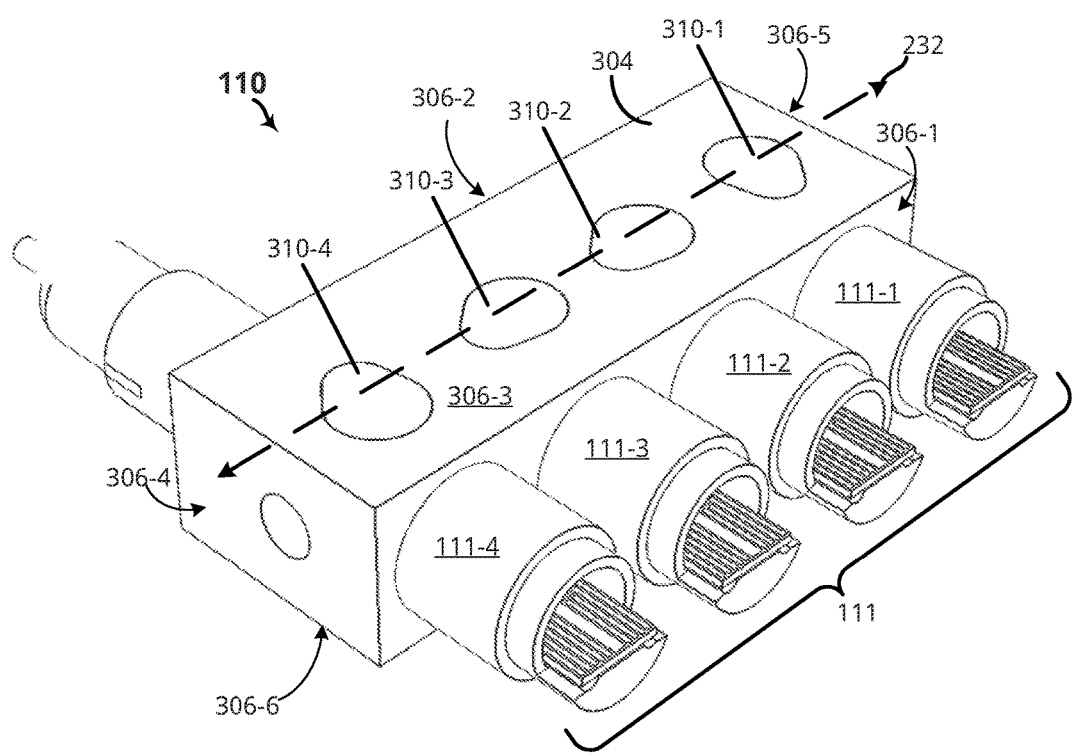
FIG. 4 shows a perspective view of the multi-channel TOSA of FIGS. 3A and 3B, in accordance with an embodiment of the present disclosure.

Turning to FIG. 4, a perspective view of the multi-channel TOSA 110 is shown in accordance with an embodiment of the present disclosure. The multi-channel TOSA 110 is shown isolated from the optical transceiver 300 for the purposes of clarity and practicality. In an embodiment, the multi-channel TOSA 110 includes a plurality of sidewalls 306-1 to 306-6, which may also be referred to as a first sidewall, second sidewall, third sidewall, fourth sidewall, fifth sidewall and sixth sidewall, respectively. The sidewall 306-1 and 306-2 are disposed opposite each other with at least the sidewall 306-3 adjoining the two. The sidewalls 306-4 and 306-5 define a first and second end, respectively, with the sidewalls 306-1 and 306-2 extending between the two along the longitudinal center line 232.

The first sidewall 306-1 includes the plurality of laser assemblies collectively indicated at 211 and individually indicated as laser assemblies 211-1 to 211-4. As discussed in greater detail below with regard to FIG. 6, each of the laser assemblies 211-1 to 211-4 may be configured to generate a specific channel wavelength. For example, the laser assembly 211-1 may be configured to emit 1330 nm channel wavelengths, the laser assembly 211-2 may be configured to emit 1310 nm channel wavelengths, the laser assembly 211-3 may be configured to emit 1290 nm channel wavelengths, and the laser assembly 211-4 may be configured to emit 1270 nm channel wavelengths. Other configurations for the laser assemblies is also within the scope of the disclosure and the aforementioned examples are not meant to be limiting. Continuing on, the second sidewall 360-2 includes an optical coupling receptacle, such as the LC receptacle 310. The third sidewall 306-3 includes a plurality of optical components 310-1 to 310-4 that collectively form multiplexing optics and are discussed in greater detail below with reference to FIG. 6.

Figure 5:
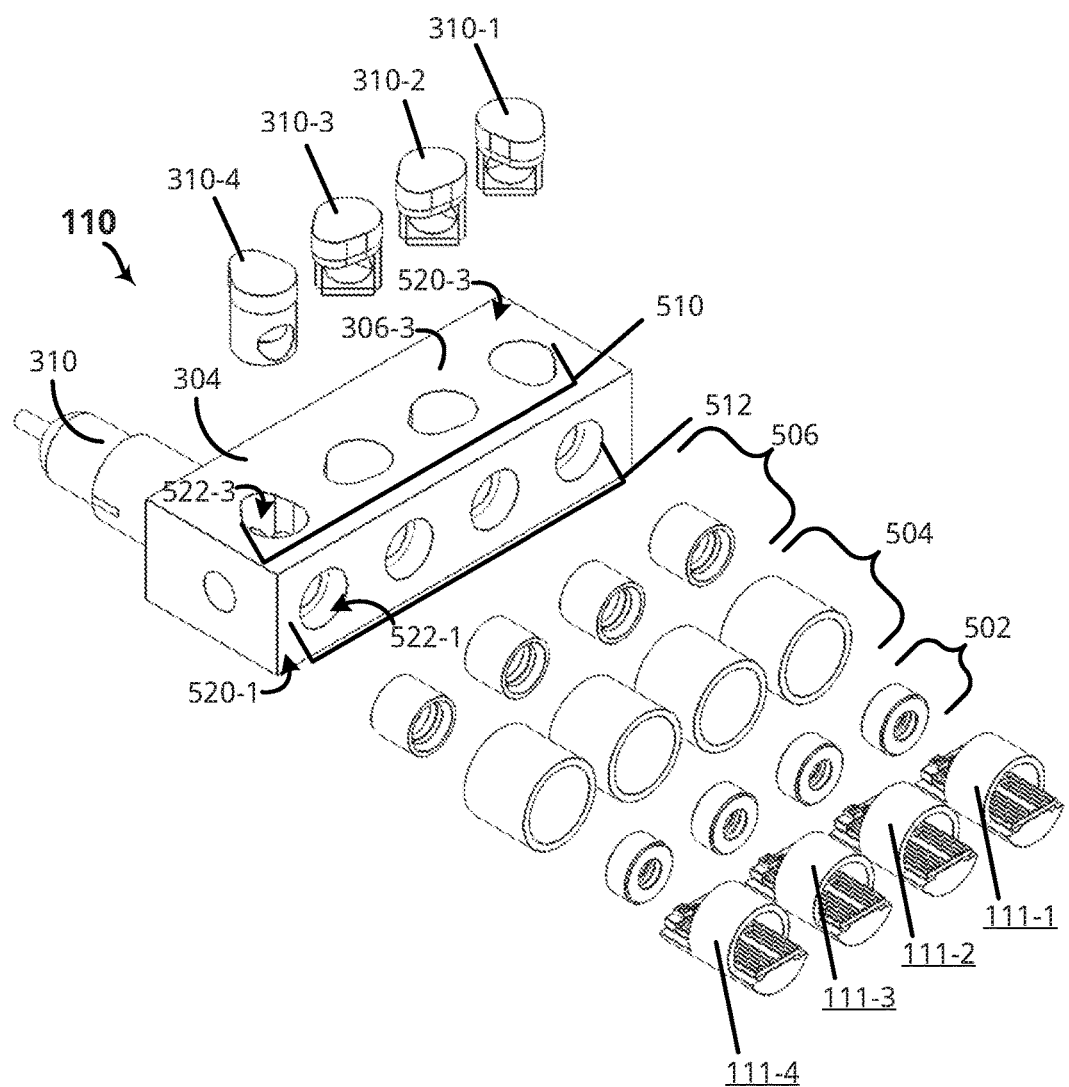
FIG. 5 shows an exploded view of the multi-channel TOSA of FIG. 4 in accordance with an embodiment of the present disclosure.

Turning to FIG. 5, the multi-channel TOSA 110 of FIG. 4 is shown in an exploded view in accordance with an embodiment of the present disclosure. As shown, the first sidewall 306-1 of the multi-channel TOSA housing 304 includes a plurality of openings 512. The openings 512 may also be accurately referred to as light input coupling ports. Each of the plurality of openings 512 is defined at least in part on a surface of the first sidewall 306-1, such as surface 522-1, that extends from an outer surface 520-1 of the first sidewall 306-1 to a cavity 602 (FIG. 6) that extends longitudinally within the multi-channel TOSA housing 304. Each of the plurality of openings 512 may couple to a respective one of the plurality of laser packages 211-1 to 211-4 by way of welding rings 504, for example. Other approaches to coupling the plurality of laser packages 211-1 to 211-4 to the housing 304 are also within the scope of this disclosure and are not necessarily limited to welding. Each of the laser packages 211-1 to 211-4 may further include additional optical components for optically coupling to the multi-channel TOSA 110, and more specifically to the first light path 606 shown in FIG. 6. For example, the plurality of laser packages 211-1 to 211-4 may include an associated collimating lens 502 and focusing lens 506.

Figure 6:
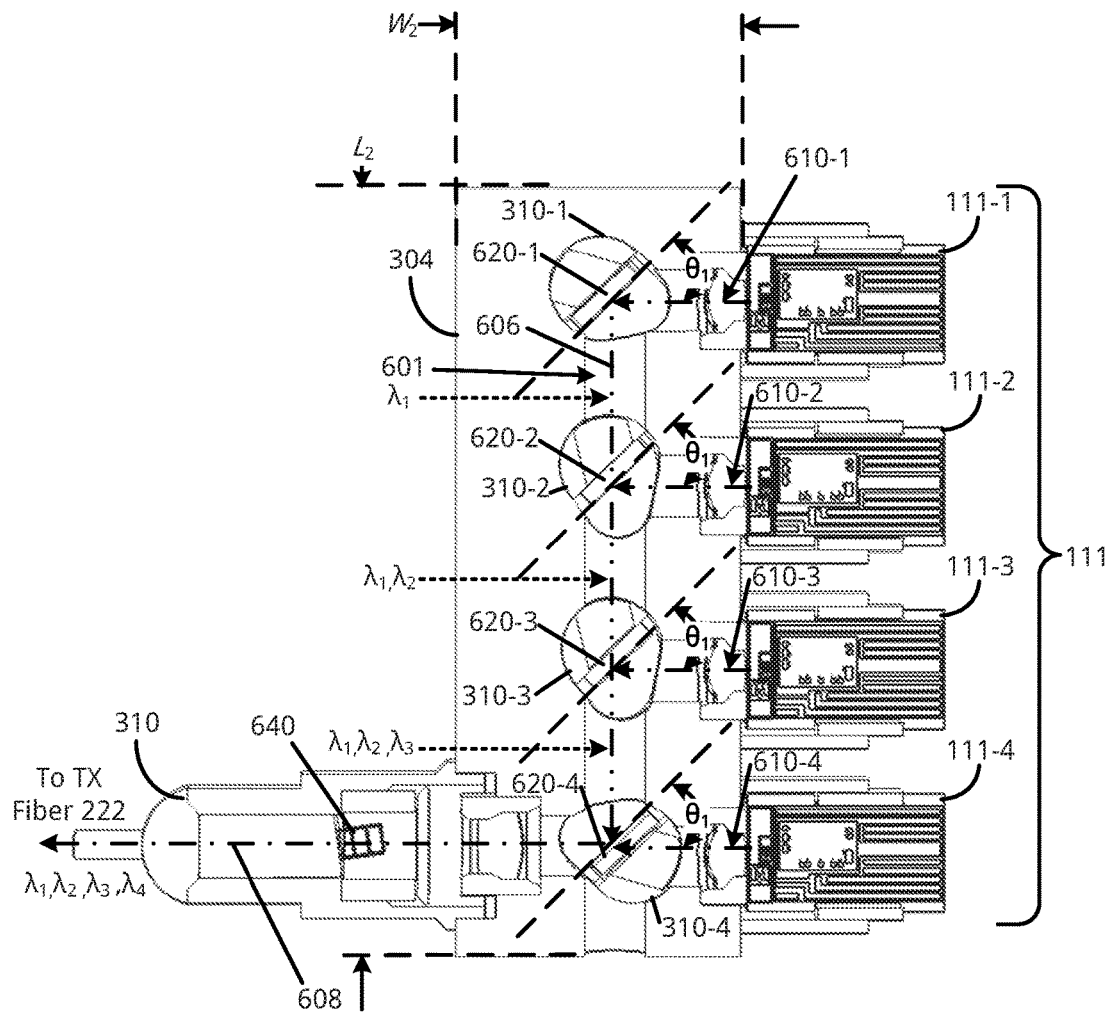
FIG. 6 shows a cross-sectional view of the multi-channel TOSA of FIG. 4 in accordance with an embodiment of the present disclosure.

As also shown, the third sidewall 306-3 of the multi-channel TOSA housing 304 includes a plurality of openings 510. Each of the plurality of openings 510 is defined at least in part on a surface of the third sidewall 306-3, such as surface 522-3, that extends from an outer surface 520-3 of the third sidewall 306-3 to the cavity 602 (FIG. 6). Each plurality of openings 510 may couple to a respective one of a plurality of optical components assemblies 310-1 to 310-4.

The plurality of optical component assemblies 310-1 to 310-4 may be accurately understood to collectively form multiplexing optics, as discussed in further detail below with regard to FIG. 6. Each of the plurality of optical component assemblies 310-1 to 310-4 may comprise, for example, filters, mirrors or other suitable optics that enable channel wavelengths emitted by the laser assemblies 211-1 to 211-4 to be combined into a multiplexed signal for transmission purposes. In some cases, the plurality of optical component assemblies 310-1 to 310-4 include thin-film WDM filters configured to selectively reflect particular channel wavelengths while passing others. Accordingly, the WDM filters may comprise long-pass and/or short pass filters depending on a desired configuration.

Turning to FIG. 6, a cross-sectional view of the multi-channel TOSA 110 is shown in accordance with an embodiment of the present disclosure. As shown, the multi-channel TOSA 110 includes a housing 304, with the housing 304 defining the cavity 601 that extends longitudinally within the same. The cavity 601 further defines a first light path 606 that passes through each of the optical component assemblies 310-1 to 310-4. Each of the optical component assemblies 310-1 to 310-4 may be accurately referred to as multiplexing optics or a multiplexing optics arrangement. The cavity 601 also further defines a plurality of input light paths 610-1 to 610-4 that are configured to optically couple light having associated channel wavelengths emitted by each of the laser assemblies 211-1 to 211-4 to the first light path 606. The cavity 601 also further defines a third light path 608 that extends substantially orthogonally relative to the first light path 606. The third light path 608 passes through an isolator 640 and other associated optics of the optical coupling receptacle 310.

In an embodiment, the overall length $L_2$ of the housing 304 measures about 13.5 mm and the overall width $W_2$ measures about 5 mm, although other widths and lengths are within the scope of this disclosure.

As further shown, each of the optical component assemblies 310-1 to 310-4 is angled relative to a respective input light path 610-1 to 610-4 in order to reflect incident light and couple the same into the first light path 606. In an embodiment, each optical component assembly 310-1 to 310-4 includes an optical component, such as optical components 620-1 to 620-3, configured at the same angle $\theta_1$ with $\theta_1$ measuring about 45 degrees±20 degrees. Other angles for each of the optical components may be utilized and the provided examples should not be construed as limiting. One specific example embodiment for the multi-channel TOSA 110 will now be discussed to further illustrate additional aspects of the same.

In accordance with an embodiment, the first optical component assembly 310-1 includes a mirror component 620-1 configured to pass a substantial portion, e.g., at least 80%, of incident light emitted by the first laser assembly 211-1. Note that the optical component 310-1 may not necessarily utilize a mirror and may instead feature any other suitably reflective component such as a thin-film filter. Continuing on, the second optical component assembly 310-2 may include a thin-film WDM filter 620-2 configured to pass channel wavelengths greater than 1310 nm and reflect wavelengths equal to or less than 1310 nm. The third optical component assembly 310-3 may include a thin-film WDM filter 620-3 configured to pass channel wavelengths greater than 1290 nm and reflect channel wavelengths less than or equal to 1290 nm. The fourth optical component assembly 310-4 may include a thin-film WDM filter 620-4 configured to pass channel wavelengths greater than 1270 nm and configured to reflect channel wavelengths less than or equal to 1270 nm.

In an embodiment, the first laser assembly 211-1 may be configured to emit 1330 nm channel wavelengths, the second laser assembly 211-2 may be configured to emit 1310 nm channel wavelengths, the third laser assembly 211-3 may be configured to emit 1290 nm channel wavelengths, and the fourth laser assembly 211-4 may be configured to emit 1270 nm channel wavelengths.

Thus, and in use, the first laser assembly 211-1 may emit light having 1330 nm channel wavelengths which is then coupled to the first light path 606 by way of the input light path 610-1 and the mirror component 620-1. Thus the portion of the first light path 606 prior to optical component assembly 310-2 may include light substantially having the first channel wavelength $\lambda_1$ of 1330 nm. The second laser assembly 211-2 may emit light having 1310 nm channel wavelengths which is then coupled to the first light path 606 by way of the input light path 610-2 and the WDM thin-film filter component 620-2 that is configured to reflect channel wavelengths less than or equal to 1310 nm. The thin-film WDM filter component 620-2 may also selectively allow incident light having channel wavelengths greater than 1310 nm to pass thus producing light having both 1330 nm and 1310 nm channel wavelengths, e.g., $\lambda_1, \lambda_2$.

Continuing on, the third laser assembly 211-3 may emit light having 1290 nm channel wavelengths which is then coupled to the first light path 606 by way of the input light path 610-3 and the thin-film WDM filter component 620-3 that is configured to reflect channel wavelengths less than or equal to 1290 nm. The WDM thin-film filter component 620-2 may also selectively allow incident light having channel wavelengths greater than 1310 nm to pass thus producing light having 1330 nm, 1310 nm and 1290 nm channel wavelengths, e.g., $\lambda_1, \lambda_2, \lambda_3$. The fourth laser assembly 211-4 may emit light having 1270 nm channel wavelengths which is then coupled to the first light path 606 by way of the input light path 610-4 and the WDM thin-film filter component 620-4 that is configured to pass channel wavelengths less than or equal to 1270 nm. The WDM thin-film filter component 620-2 may also selectively reflect incident light having channel wavelengths greater than 1270 nm to pass thus producing light having 1330 nm, 1310 nm, 1290 nm, and 1270 nm channel wavelengths, e.g., $\lambda_1, \lambda_2, \lambda_3, \lambda_4$. The WDM thin-film filter component 620-4 may also optically couple/lunch the multiplexed optical signal having each of channel wavelengths $\lambda_1, \lambda_2, \lambda_3, \lambda_4$ to the second light path 608. The second light path 608, in turn, may optically couple to the external transmit fiber 222 via the optical coupling receptacle, for transmission purposes.

The particular arrangement of optical components shown along the first light path 606 is designed to accommodate the particular channel wavelengths emitted by the laser assemblies 211-1 to 211-4. Accordingly, other laser assembly and optical component arrangements may be implemented with minor modification to launch a multiplexed optical signal along the first and second light paths 606 and 608. Thus the specific example scenarios and examples discussed herein should not be construed as limiting the present disclosure.

Further Example Embodiments

In accordance with an aspect of the present disclosure an optical transceiver module is disclosed. The optical transceiver module comprising a transceiver housing comprising a plurality of sidewalls extending from a first end to a second end along a first longitudinal axis, a multi-channel transmitter optical subassembly (TOSA) comprising at least first and second sidewalls that extend from a first end to a second end along a second longitudinal axis, wherein the multi-channel TOSA includes a plurality of laser assemblies disposed along the first sidewall, and a transmit connecting circuit at least partially disposed in the transceiver housing and configured to drive the multi-channel TOSA, wherein the multi-channel TOSA is disposed in a position adjacent the transmit connecting circuit within the transceiver housing in a perpendicular orientation, wherein the perpendicular orientation includes the second longitudinal axis of the multi-channel TOSA being substantially transverse to the first longitudinal axis of the transceiver housing.

In accordance with another aspect of the present disclosure an optical transceiver module is disclosed. The optical transceiver module comprising a transceiver housing comprising a plurality of sidewalls extending from a first end to a second end along a first longitudinal axis, a multi-channel transmitter optical subassembly (TOSA) comprising at least first and second sidewalls that extend from a first end to a second end along a second longitudinal axis, wherein the multi-channel TOSA includes a plurality of laser assemblies disposed along the first sidewall, and a transmit connecting circuit at least partially disposed in the transceiver housing and configured to drive the multi-channel TOSA, wherein the multi-channel TOSA is disposed in a position adjacent the transmit connecting circuit within the transceiver housing in a perpendicular orientation, wherein the perpendicular orientation includes the second longitudinal axis of the multi-channel TOSA being substantially transverse to the first longitudinal axis of the transceiver housing, a multi-channel receiver optical subassembly (ROSA) disposed within the transceiver housing.

In accordance with another aspect of the present disclosure a transmitter optical subassembly (TOSA) is disclosed. The TOSA comprising a housing comprising a plurality of sidewalls that extend from a first end to a second end along a longitudinal axis, wherein the plurality of sidewalls include at least a first sidewall disposed opposite a second sidewall, and a third sidewall adjoining the first and second sidewalls, and wherein the plurality of sidewalls define a cavity, a first light path provided by the cavity that extends substantially in parallel with the longitudinal axis of the housing, a plurality of light input coupling ports disposed along the first sidewall, each light input coupling port providing an input light path that intersects with the first light path, a plurality of laser assemblies for generating light with different associated channel wavelengths, each laser assembly optically coupled to a respective light input coupling port such light generated thereby is launched towards the first light path along an input light path provided by the respective light input coupling port, a second light path that extends at least partially into the cavity and is substantially orthogonal to the first light path, an optical output port disposed on the second sidewall and having a first end for optically coupling to an external transmit fiber, and a second end for optically coupling to the second light path, and an optical multiplexing arrangement disposed within the cavity along the first light path, wherein the optical multiplexing arrangement is configured to optically couple channel wavelengths received via each input light path to the first light path to form a multiplexed light signal, and optically couple the multiplexed light signal to the second light path.

While the principles of the disclosure have been described herein, it is to be understood by those skilled in the art that this description is made only by way of example and not as a limitation as to the scope of the disclosure. Other embodiments are contemplated within the scope of the present disclosure in addition to the exemplary embodiments shown and described herein. Modifications and substitutions by one of ordinary skill in the art are considered to be within the scope of the present disclosure, which is not to be limited except by the following claims.

What is claimed is:

1. An optical transceiver module comprising:
    a transceiver housing comprising a plurality of sidewalls extending from a first end to a second end along a first longitudinal axis;
    a multi-channel transmitter optical subassembly (TOSA) comprising a housing having at least first and second sidewalls that extend from a first end to a second end along a second longitudinal axis, wherein the multi-channel TOSA includes a plurality of laser assemblies coupled to the first sidewall; and
    a transmit connecting circuit at least partially disposed in the transceiver housing and configured to drive the multi-channel TOSA,
    wherein the multi-channel TOSA is disposed in a position adjacent the transmit connecting circuit within the transceiver housing in a substantially perpendicular orientation, wherein the substantially perpendicular orientation includes the second longitudinal axis of the multi-channel TOSA being substantially transverse to the first longitudinal axis of the transceiver housing;

a multi-channel receiver optical subassembly (ROSA) disposed within the transceiver housing; and wherein the position of the multi-channel TOSA provides a distance D1 between each of the plurality of laser assemblies and the transmit connecting circuit, wherein D1 measures up to about 120 microns.

2. The optical transceiver module of claim 1, wherein the multi-channel TOSA includes at least four laser assemblies configured to generate different associated channel wavelengths.

3. The optical transceiver module of claim 1, wherein the multi-channel TOSA includes multiplexing optics for multiplexing N number of channel wavelengths into a multiplexed optical signal.

4. The optical transceiver module of claim 1, wherein the position of the multi-channel TOSA causes each of the plurality of laser assemblies to directly contact the transmit connecting circuit.

5. The optical transceiver module of claim 1, wherein each of the plurality laser assemblies include a distributed feedback (DFB) laser assembly.

6. The optical transceiver module of claim 1, wherein each of the plurality of laser assemblies comprise a plurality of traces for providing electrical signals to an associated laser device, and wherein the transmit connecting circuit comprises a printed circuit board having traces adjacent to each of the plurality of laser assemblies.

7. The optical transceiver module of claim 6, wherein the plurality of traces for a given laser assembly of the plurality of laser assemblies is no greater than 120 microns from adjacent traces of the transmit connecting circuit.

8. The optical transceiver module of claim 1, wherein the optical transceiver module is implemented in a small form-factor (SFF) housing.

9. An optical transceiver module comprising:

a transceiver housing comprising a plurality of sidewalls extending from a first end to a second end along a first longitudinal axis;

a multi-channel transmitter optical subassembly (TOSA) comprising:

at least first and second sidewalls that extend from a first end to a second end along a second longitudinal axis, wherein the multi-channel TOSA includes a plurality of laser assemblies disposed along the first sidewall;

a transmit connecting circuit at least partially disposed in the transceiver housing and configured to drive the multi-channel TOSA;

wherein the multi-channel TOSA is disposed in a position adjacent the transmit connecting circuit within the transceiver housing in a substantially perpendicular orientation, wherein the substantially perpendicular orientation includes the second longitudinal axis of the multi-channel TOSA being substantially transverse to the first longitudinal axis of the transceiver housing;

and wherein the position of the multi-channel TOSA causes each of the plurality of laser assemblies to directly contact the transmit connecting circuit; and a multi-channel receiver optical subassembly (ROSA) disposed within the transceiver housing.

10. The optical transceiver module of claim 9, wherein each of the plurality of laser assemblies comprise a plurality of traces for providing electrical signals to an associated laser device, and wherein the transmit connecting circuit comprises a printed circuit board having traces adjacent to each of the plurality of laser assemblies.

11. The optical transceiver module of claim 10, wherein the plurality of traces for a given laser assembly of the plurality of laser assemblies is no greater than 120 microns from adjacent traces of the transmit connecting circuit.

* * * * *